US012538980B2

(12) United States Patent
Benner

(10) Patent No.: US 12,538,980 B2
(45) Date of Patent: Feb. 3, 2026

(54) UNIVERSAL RAIL KIT

(71) Applicant: Vertiv Corporation, Westerville, OH (US)

(72) Inventor: Peter Alan Benner, Powell, OH (US)

(73) Assignee: Vertiv Corporation, Westerville, OH (US)

(*) Notice: Subject to any disclaimer, the term of this patent is extended or adjusted under 35 U.S.C. 154(b) by 97 days.

(21) Appl. No.: 18/392,735

(22) Filed: Dec. 21, 2023

(65) Prior Publication Data
US 2024/0225282 A1 Jul. 11, 2024

Related U.S. Application Data

(60) Provisional application No. 63/437,862, filed on Jan. 9, 2023.

(51) Int. Cl.
*A47B 96/07* (2006.01)
(52) U.S. Cl.
CPC .................... *A47B 96/07* (2013.01)
(58) Field of Classification Search
CPC ....... A47B 88/00; A47B 88/40; A47B 88/423; A47B 88/427; A47B 88/43; A47B 96/06; A47B 96/061; A47B 96/067; A47B 96/068; A47B 96/07; A47B 96/14; A47B 96/1441; A47B 96/16; H05K 7/1488; H05K 7/1489; H05K 7/183
USPC ...................................................... 312/223.1
See application file for complete search history.

(56) References Cited

U.S. PATENT DOCUMENTS

| | | | | |
|---|---|---|---|---|
| 6,739,682 B2* | 5/2004 | Shih | ..................... | H05K 7/1421 312/334.4 |
| 8,358,502 B2* | 1/2013 | Gomez | ................ | H05K 7/1489 248/183.3 |
| 8,701,902 B2* | 4/2014 | Oura | ..................... | H05K 7/1421 312/334.3 |
| 8,721,012 B2* | 5/2014 | Chen | ..................... | A47B 88/49 312/334.4 |
| 9,699,935 B1* | 7/2017 | Marrs | .................... | A47B 88/00 |
| 10,492,610 B2* | 12/2019 | Chen | ..................... | A47B 88/75 |
| 11,659,679 B1* | 5/2023 | Marcade | ............... | H05K 7/183 312/334.1 |
| 2006/0157436 A1* | 7/2006 | Iwamoto | ................ | A47B 57/30 211/26 |
| 2008/0035588 A1* | 2/2008 | Liang | ................... | H05K 7/1489 211/26 |
| 2014/0086665 A1* | 3/2014 | Baik | ..................... | H05K 7/1489 403/13 |

(Continued)

Primary Examiner — Joshua E Rodden

(57) ABSTRACT

The present disclosure is directed to a universal slide rail assembly used to support an electronic unit, per an embodiment. The slide rail assembly includes a support member and a slidable member. The support member is a flat body with a first side and a second side and a proximal end and distal end. The first side has a proximal upper and lower coupling tab, and a distal upper and lower coupling tab. A support ledge extends from the second side of the support member and includes a mounting tab on the proximal end. The slidable member is a flat body with a proximal and distal end, and a first and second side. The slidable member includes a separation line between the proximal and distal end on the second side. The slidable member is freely movable between a first position and a second position relative to the support member.

20 Claims, 6 Drawing Sheets

(56) References Cited

U.S. PATENT DOCUMENTS

2018/0360215 A1\* 12/2018 Chen .................... A47B 96/067
2024/0225282 A1\* 7/2024 Benner ................. A47B 96/07

\* cited by examiner

UNIVERSAL RAIL KIT

CROSS-REFERENCE TO RELATED APPLICATIONS

This application claims the benefit of U.S. Provisional Patent Application No. 63/437,862, filed Jan. 9, 2023, the entire disclosure of which is incorporated herein by reference.

BACKGROUND

Electronic information handling systems are often stored vertically within rack systems to make access easier and to standardize the mounting of such systems. A common mounting system is the EIA rack cabinet system (also known as a server rack). These rack systems can accommodate a variety of electronic systems, such as servers, routers, network switches, power distribution units, and storage devices. Current standard rack designs provide for a two-post or a four-post structural configuration.

In a two-post configuration, two vertical support members are connected at least at the top by a horizontal support member. Electronic information handling systems can be mounted to the two vertical support members. Each electronic information handling system is mounted to both of the two vertical support members. Since these two-post racks have only a single support on each side, two-post configurations can be beneficial for electronic informational systems that have a low weight, such as network switches and panels. In addition, a two-post rack can typically cost less and allow for easier installation of the electronic information handling system as well as access to the front and back of mounted systems.

A four-post rack has four vertical support members that are connected at least at the top by four horizontal support members. Electronic information handling systems are mounted to the four vertical support members. In contrast to a two-post rack, systems mounted in a four-post rack are mounted to a greater number of support members. The additional support members give four-post racks additional stability, allowing them to hold more weight. Most types of computer equipment can fit into a standard four-post rack, and the additional stability gives the mounted equipment additional protection against inadvertent contact. A two-post or four-post rack typically has a width of 20" to 23", while the depth of a four-post rack can be anywhere between 29" and 36".

There currently exists a large number and variety of rack mounting kits for both a two-post rack or a four-post rack. Given the large range of rack depths, users must purchase a rail mounting kit for either a two-post or four-post rack and a specific rack depth. If a user decides to change the rack depth or change from a two-post to four-post, or from a four-post to a two-post, the user must purchase a new rail mounting kit.

BRIEF DESCRIPTION OF DRAWINGS

The detailed description is described with reference to the accompanying figures.

SUMMARY

Figure 1A:
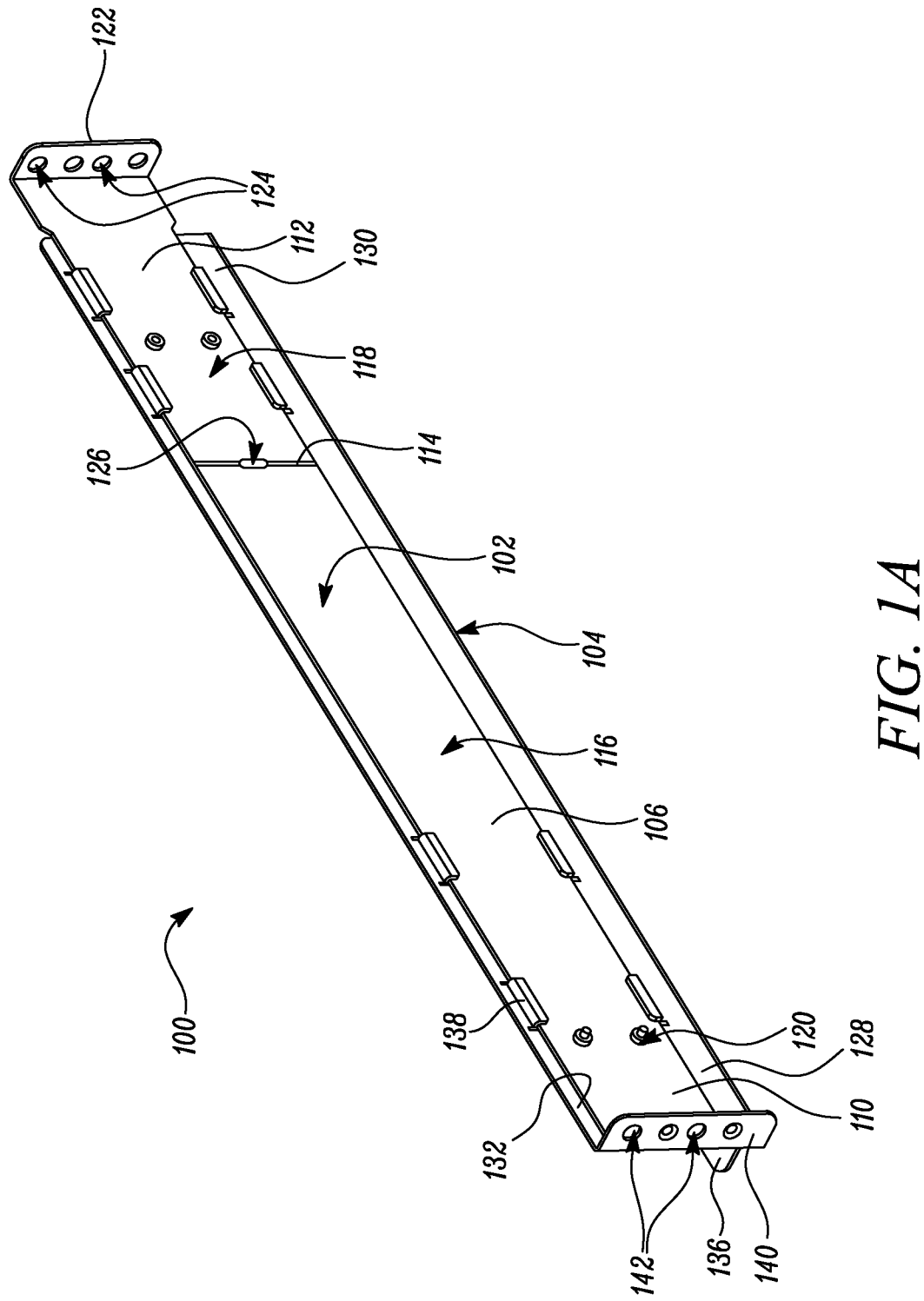
FIG. 1A illustrates a first perspective view of a universal rail kit in a retracted position, with respect to an example embodiment of the present disclosure.

This section provides a general summary of the disclosure and is not a comprehensive disclosure of its full scope or all of its features.

In an embodiment, the present disclosure is directed to a slide rail assembly that supports an electronic unit. The slide rail assembly includes a support member and a slidable member. The support member is a flat body, with a first side and a second side, having a proximal end and a distal end. The first side of the support member has a proximal upper coupling tab, a proximal lower coupling tab, a distal upper coupling tab, and a distal lower coupling tab. The first support member can include a support ledge that extends from the second side of the support member at least partially between the proximal end and the distal end of the support member. The support ledge includes a mounting tab that extends from the first side and from the proximal end.

The slidable member of the slide rail assembly has a flat body, with a first side and a second side, having a proximal end and a distal end. The first side of the slidable member includes a separation line positioned between the proximal end and distal end of the flat body. The slidable member further includes a mounting tab that extends from the first side and the distal end.

The slidable member is freely movable between a first position and a second position. The slidable member is in the first position when the flat body of the slidable member engages the distal upper coupling tab and the distal lower coupling tab. The slidable member is in the second position when the flat body engages the proximal upper coupling tab and the proximal lower coupling tab. Both the first and the second position are configured to support an electronic unit in a rack. The computer rack may have a depth of 24", or it may have a depth of 36".

The sliding member further consists of a first portion and a second portion. The second portion can be detached from the first portion at a separation line. The sliding member can further include a separation tool hole to assist with detachment of the second portion from the first portion at the separation line.

Another aspect of the invention is directed to a system for housing an electronic unit in a computer rack. The system includes a computer rack with a number of vertical support members and horizontal support members and a slide rail assembly that consists of a first support member and a sliding member. It is contemplated that the sliding member is movable between a first position and a second position relative to the first support member. The first support member of the system contains a mounting tab with mounting holes for mounting the slide rail assembly on the computer rack. The sliding member of the system also includes a mounting tab with mounting holes for mounting the slide rail assembly on the computer rack. The computer rack can include two or four vertical support members.

Another aspect of the invention is directed to a method of supporting an electronic unit in a computer rack using a slide rail assembly. The method includes attaching a first support member to the computer rack, attaching a sliding member to the first support member, moving the sliding member between a first and second portion in relation to the first support member, and placing an electronic unit on a support ledge of the first support member. The method may further include locking the sliding member to the first support member using a locking track along the length of the first support member. The method may further include ensuring that, when moving the sliding member between a first and second position, ensuring that the slide rail assembly is attached at two points to the computer rack.

DETAILED DESCRIPTION

Aspects of the disclosure are described more fully hereinafter with reference to the accompanying drawings, which form a part hereof, and which show, by way of illustration, example features. The features can, however, be embodied in many different forms and should not be construed as limited to the combinations set forth herein; rather, these combinations are provided so that this disclosure will be thorough and complete and will fully convey the scope. The following detailed description is, therefore, not to be taken in a limiting sense.

The present disclosure offers a solution for both the issue of different rack types and different rack depths. Instead of requiring a user to discard existing rail mount systems, a user can simply adjust the length of the rail to the needed depth. In addition, the present disclosure can be used in both a two-post and four-post rack system. In the case of a two-post rack, the rail kit can be configured to front-mount or center-mount a server.

In a present embodiment, the solution can be achieved using a pair of universal rack mounts that are able to support an electronic information handling system in either a variable length relative to a two-post or four-post rack, as needed. For example, a user can detach part of the slidable portion, thereby shortening the length of the slidable portion and allowing a user to center mount an electronic information handling system in a two-post rack. In another related embodiment, the detached portion of the slidable member can be cantilever-mounted via a proximal end thereof to carry and electronic information handling system in a two-post rack. Furthermore, small openings down the length of the rigid support piece and slidable piece allow the two pieces to be coupled together at a selected position using at least one fastening mechanism.

Shown throughout the figures, the present disclosure is directed towards a universal rail kit and towards a computer rack assembly that utilizes the universal rail kit. Referring initially to FIGS. 1-2, a universal rail kit 100 is illustrated in accordance with an example embodiment of the present disclosure.

Figure 1B:
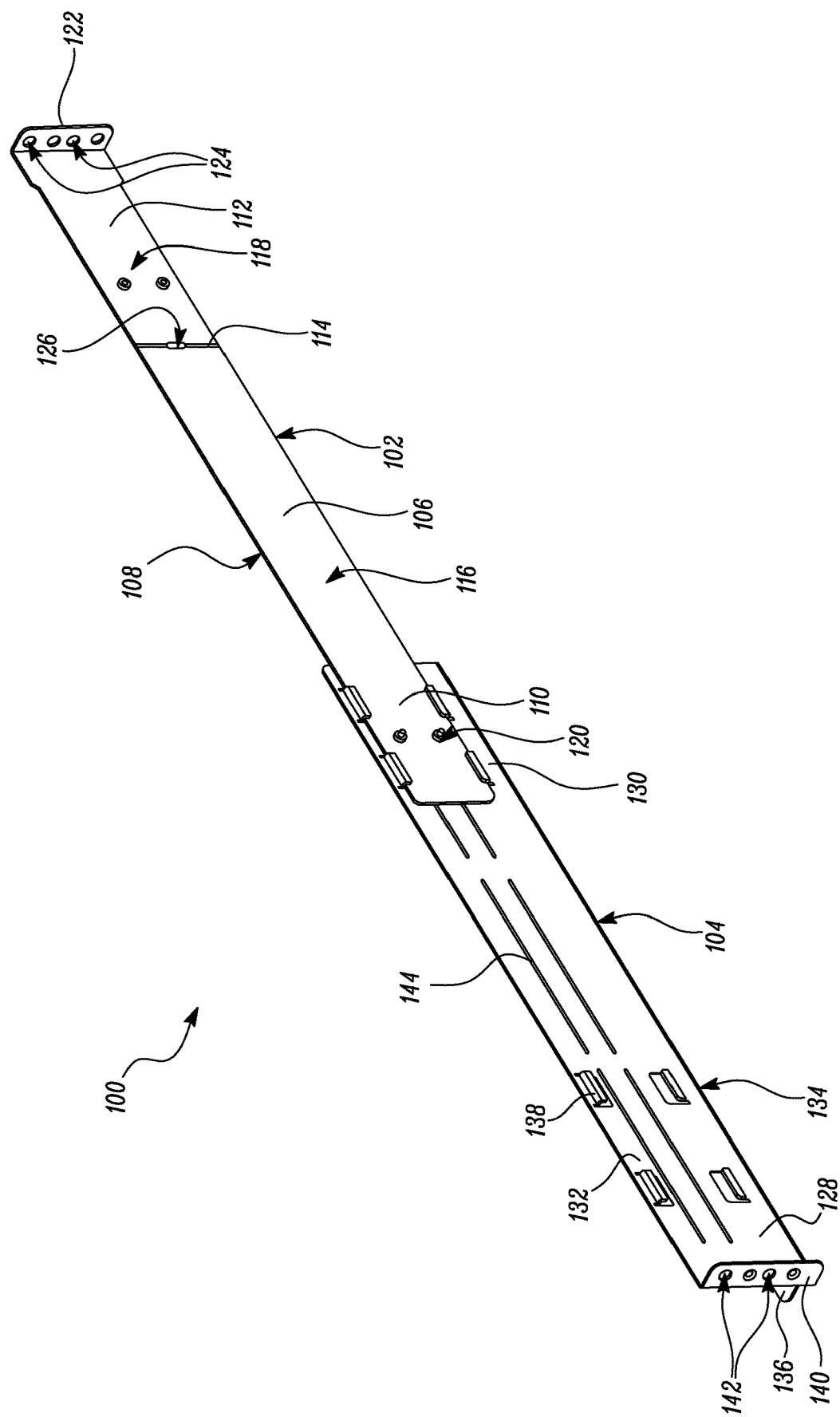
FIG. 1B illustrates the universal rail kit of FIG. 1A in an extended position.

FIG. 1A illustrates a universal rail kit 100 in a retracted position, while FIG. 1B illustrates the universal rail kit 100 in an extended position. The universal rail kit 100 includes a slidable member 102 and a support member 104. The slidable member 102 includes a front side 106, a rear side 108, a proximal end 110, and a distal end 112. Further, the slidable member 102 can have a separation line 114, a first portion 116 and a second portion 118. The first portion 116 is located at the proximal end 110 of the slidable member 102 relative to the separation line 114 and the second portion 118 is located at the distal end 112 of the slidable member 102 relative to the separation line 114. The separation line 114 can extend vertically down the height (e.g., a majority or an entirety) of the slidable member 102 and can be positioned at any point between the proximal end 110 and the distal end 112 of the slidable member 102. In an embodiment, the separation line 114 is located off-center relative to the length of the slidable member 102, to facilitate the formation of a first portion 116 with length different than that that of the second portion 118. Such different length portions 116, 118 facilitate the range of uses of the universal rail kit 100.

Further, the slidable member 102 can include a number of fixing holes 120 that allow for the slidable member 102 to be fixed in place relative to the support member 104 at any of various lateral positions. The distal end 112 of the slidable member 102 has a slide mounting surface 122 that is meant to interface with a vertical support member of a two-post or four-post rack system. The slide mounting surface 122 has at least one slide member through hole 124 to allow for mounting on the vertical support member using a screw or anchor.

The separation line 114 can be designed to allow a user to separate the first portion 116 from the second portion 118 of the slidable member 102. In the present embodiment, the separation line 114 can take the form of a V-shaped notch on the rear side 108 of the slidable member 102. The shape of the notch can allow the slidable member 102 to maintain its full load bearing capabilities while also allowing a user to separate the portions 116, 118 from each other. As will be discussed later, the position of the separation line 114 along the length of the slidable member 102 can be particularly chosen to allow for use in a variety of two-post and four-post computer rack systems.

Figure 2A:
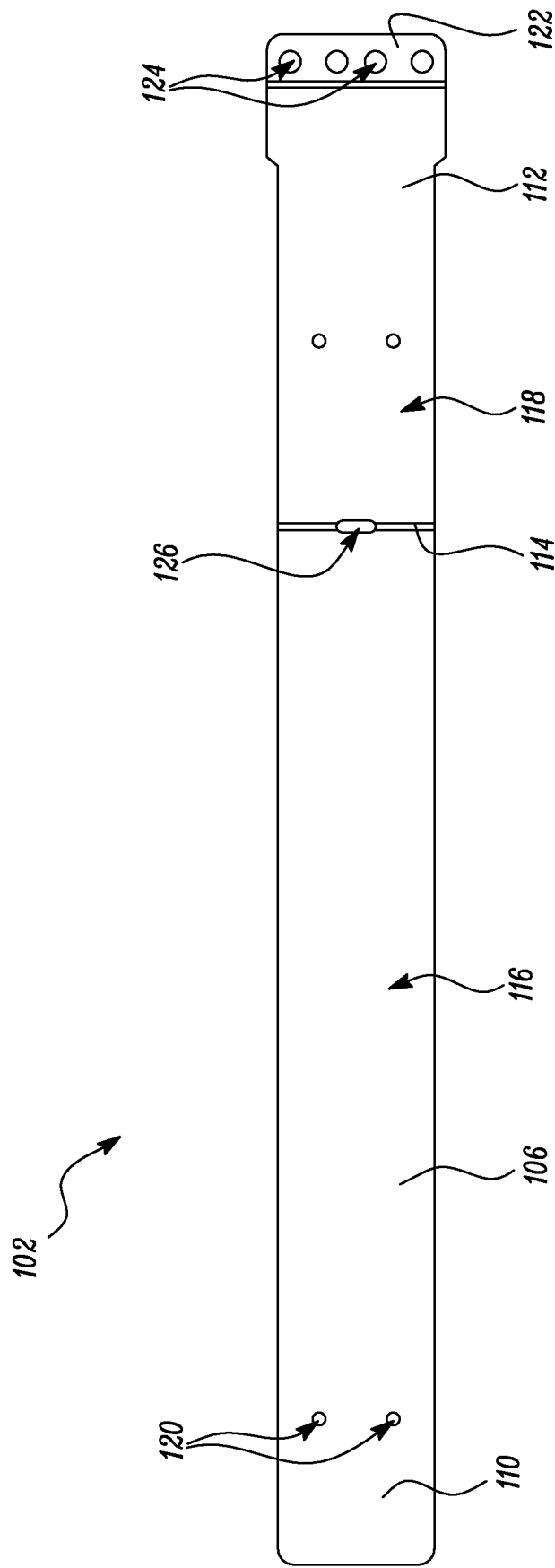
FIG. 2A illustrates a side view of a slidable member of the universal rail kit of FIGS. 1A-1B.

Further, the separation line 114 can include a separation tool hole 126. In some embodiments, the separation tool hole 126 can be sized to allow for insertion of a tool portion to assist in separating the first portion 116 from the second portion 118. In this example embodiment, as illustrated in FIG. 2A, the separation tool hole 126 can be an oval shape, allowing for insertion of a flat head portion of a standard flat head screwdriver as the tool portion to assist in separation (e.g., via a prying action). It is to be understood, however, that the separation tool hole 126 can take on any shape (e.g., slot, rectangle, etc.) that facilitates the receipt of a tool portion (e.g., screwdriver head) capable of assisting the desired separation.

Additionally, FIGS. 1A-1B illustrate a support member 104 coupled with the slidable member 102. The support member 104 can have a proximal end 128, a distal end 130, a front side 132, and a rear side 134. The support member 104 can be a flat metallic piece that can have an "L shaped" support rail 136 that runs down a majority, if not the entirety, of the length of the front side 132 of the support member 104. Further, in an embodiment, the support member 104 has at least two coupling tabs or ledges 138 on the rear side 134 of the support member 104. One or more such coupling tabs 138 is able to correspondingly engage and support the slidable member 102. The coupling tabs 138 extend outwardly from the rear side 134 of the support member 104 and then towards the center of the rear side 134. In an embodiment, a chosen coupling tab 138 can define an "L" or half-U shape and otherwise be configured to engage and aid in the retention of a corresponding section of the slidable member 102. In an embodiment, a pair of coupling tabs 138 (e.g., an upper and a lower tab) can cooperate to aid in the retention of at least a section of the slidable member 102.

Further, the proximal end 128 of the support member 104 has a support mounting surface 140 that can interface with the vertical support member of a two-post or four-post rack system. The support mounting surface 140 can extend orthogonal or substantially orthogonal (e.g., 85-95°) to the length of the support member 140 to facilitate the abutment thereof against a corresponding post. The support mounting surface 140 can have at least one support mounting through hole 142 that can assist with mounting on a vertical support member using an elongate fastener, such as a screw or anchor.

In addition, FIG. 1B particularly illustrates that multiple slide locking tracks 144 are present in the body of the support member 104. The slide locking tracks 144 extend through the support member 104 the front side 132 to the rear side 134. The slide locking tracks 144 can be used in combination with a corresponding fixing hole 120 on the slidable member 102. In particular, a threaded fastener can extend through the slide locking track 144 and a corresponding fixing hole 120 and, upon tightening with a related nut, can fix the slidable member 102 in place (particularly laterally) relative to the support member 104. Additionally, FIG. 1B illustrates the slidable member 102 can be constrained to the support member 104 using less than all of the coupling tabs 138 on the support member 104.

In an embodiment, the slidable member 102 and the support member 104 can be stamped metallic pieces formed out of larger pieces of sheet metal. The coupling tabs 138 can be integrally formed (e.g., included as part of the stamped component and shaped via bending apparatus) or attached thereto (e.g., via a weld or solder, if metallic). If the coupling tabs 138 are made of a non-metallic material, like a plastic or a composite material, they can be attached using a resin or polymer glue. In addition, both the slidable member 102 and the support member 104 can be entirely formed from a non-metallic material. The slide locking tracks 144 can be cut out of the support member 104 using a laser printer, CNC mill, or other precision cutting tools. Similar tools can be used to cut out the fixing holes 120 on the slidable member 102, the slide member through holes 124 on the slide mounting surface 122, and the support mounting through holes 142 on the support mounting surface 140.

Figure 2B:
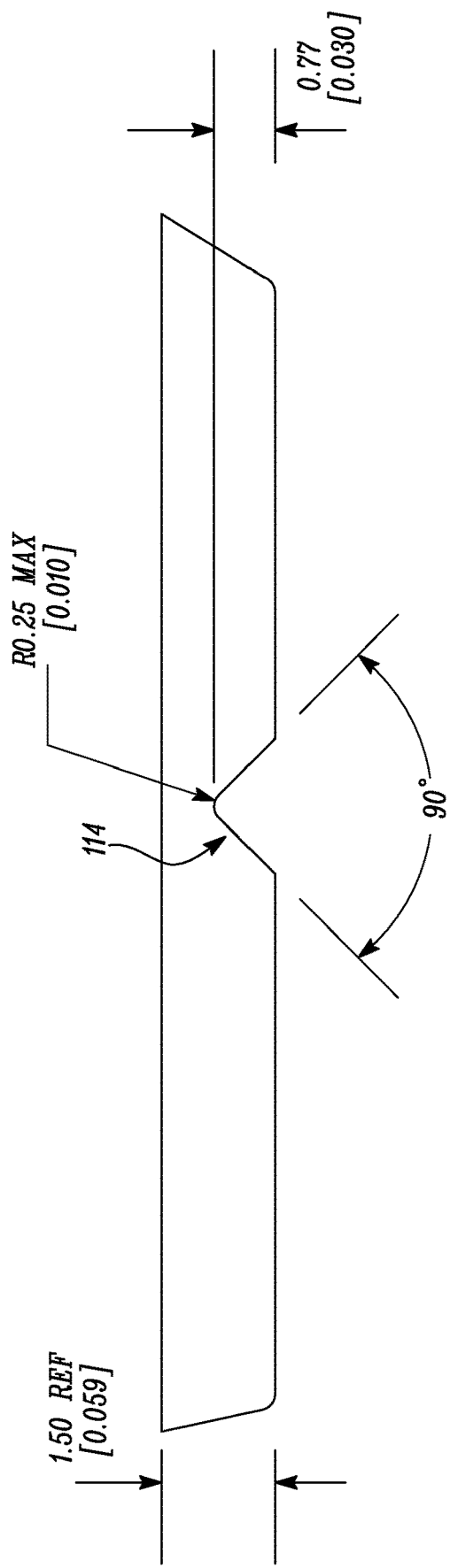
FIG. 2B illustrates a detailed top view of the slidable member of FIG. 2A.

FIGS. 2A-2B further illustrates the slidable member 102 in a detailed view. As shown in FIG. 2A, in the present embodiment, the separation line 114 is located approximately two-thirds towards the distal end 112 of the slidable member 102. Further, the slide mounting surface 122 includes four slide member through holes 124 spaced evenly that can be mounted on a vertical rack support member. As shown in FIG. 2B, the separation line 114 is a notch cut in to the slidable member 102. By way of example, the notch can be a 0.77 cm (0.3 inch) cut within the full 1.50 cm (0.6 inch) thickness of the slidable member 102. The notch can be made by cutting out material of the slidable member 102 at a 90-degree angle to help ensure that the slidable member does not lose any of its load bearing capacity to hold an electronic system within a computer rack. To be effective, the universal rail kit 100 must be able to support the weight of an electronic information handling system in a computer rack. The vertical force vector acts downward from the electronic information handling system and is transferred to the universal rail kit 100, specifically the support member 104. The notch that is cut out of the slidable member 102 is cut vertically therein, allowing the slidable member 102 to retain a sufficient load bearing capacity, as part of the universal rail kit 100. The notch being a vertical cut does result in a reduction of horizontal stability, however given the application of the universal rail kit 100, the reduction in horizontal stability does not unduly impact performance. The notch does, however, give rise to an important structural feature of the disclosure, allowing a user to detach the first portion 116 without specialized, complex, and costly tools. Thus, in an embodiment, the notch shape and/or depth can be chosen to facilitate the detachment of the first portion 116 while allowing the slidable member to be sufficiently strong and durable, when left intact, to help carry a corresponding electronic information handling system.

If a user desires to detach the first portion 116 of the slidable member 102 from the second portion 118 of the slidable member 102 at the separation line 114, a user can use a handheld tool, such as a flathead screwdriver, or even with only the user's bare hands. To use a handheld tool, the user can insert the tool into the separation tool hole 126 and can apply a simultaneous torquing force to the tool and the second portion 118. To use their bare hands, a user can simultaneously grip the slidable member 102 on opposite sides of the separation line 114 (e.g., near the proximal end 110 and distal end 112, respectively) and apply a torquing force to both ends.

It is to be readily understood, however, that other placements of the separation line 114 (e.g., along the length of the slidable member 102) and/or related notch configuration (e.g., depth or shape) can be possible. For example, the notch depth can be chosen to be sufficient to retain adequate strength of the slidable member 102 while fully intact, yet deep enough to facilitate separation of the slidable member at the notch. In an embodiment, the notch depth can range from 15% to 60% of the thickness of the slidable member or 30% to 55% of such thickness. In an embodiment, the notch shape can be at least partially curved (e.g., U-shaped) instead of fully angular, to reduce stress risers thereat. The location of the separation line 114 can be selected to allow for minimal waste of material when converting from a 4-post configuration to a 2-post configuration.

Figure 3:
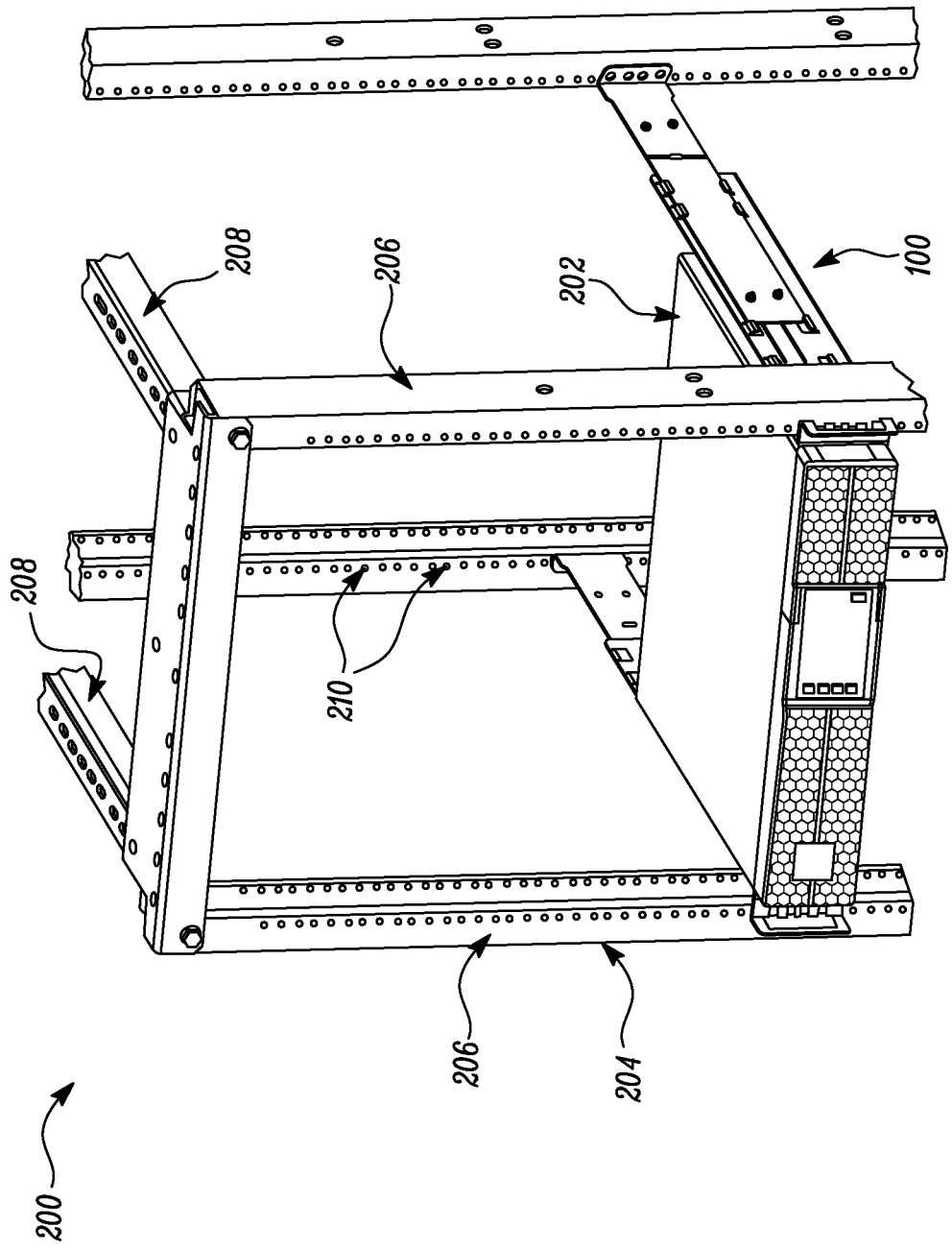
FIG. 3 illustrates a first perspective view of a computer rack assembly employing a universal slide rail kit, with respect to an example embodiment of the present disclosure.

FIG. 3 illustrates a computer rack assembly 200 that utilizes the universal rail kit 100. In embodiments, the rack mountable system 202 can, by way of example, be a server blade, a power supply unit, a keyboard, video, and mouse (KVM) switch, or a network patch panel. A four-post computer rack 204 has four vertical support members or posts 206 and four horizontal support members 208, wherein the four horizontal support members 208 are connected to the vertical support members or posts 206 at least at the top ends of the vertical support members or posts 206. The four vertical support members 206 define a plurality of post mounting holes 210 along its vertical length (e.g., majority or entirety thereof). These post mounting holes 210 are meant to selectively interface with the slide mounting surface 122 on the slidable member 102, as well as the support mounting surface 140 of the support member 104. In the implementation shown in FIG. 2, the slidable member 102 can be partially extended relative to the support member 104 to fit the specific dimensions of the four-post computer rack 204, while still structurally engaging a portion of the support member 104. In other embodiments, depending on the depth dimension of the four-post computer rack 204, the slidable member 102 may be further extended or retracted relative to the support member 104, as needed to facilitate mounting of the universal rail kit 100 with a corresponding pair of the vertical support members 206.

Figure 4:
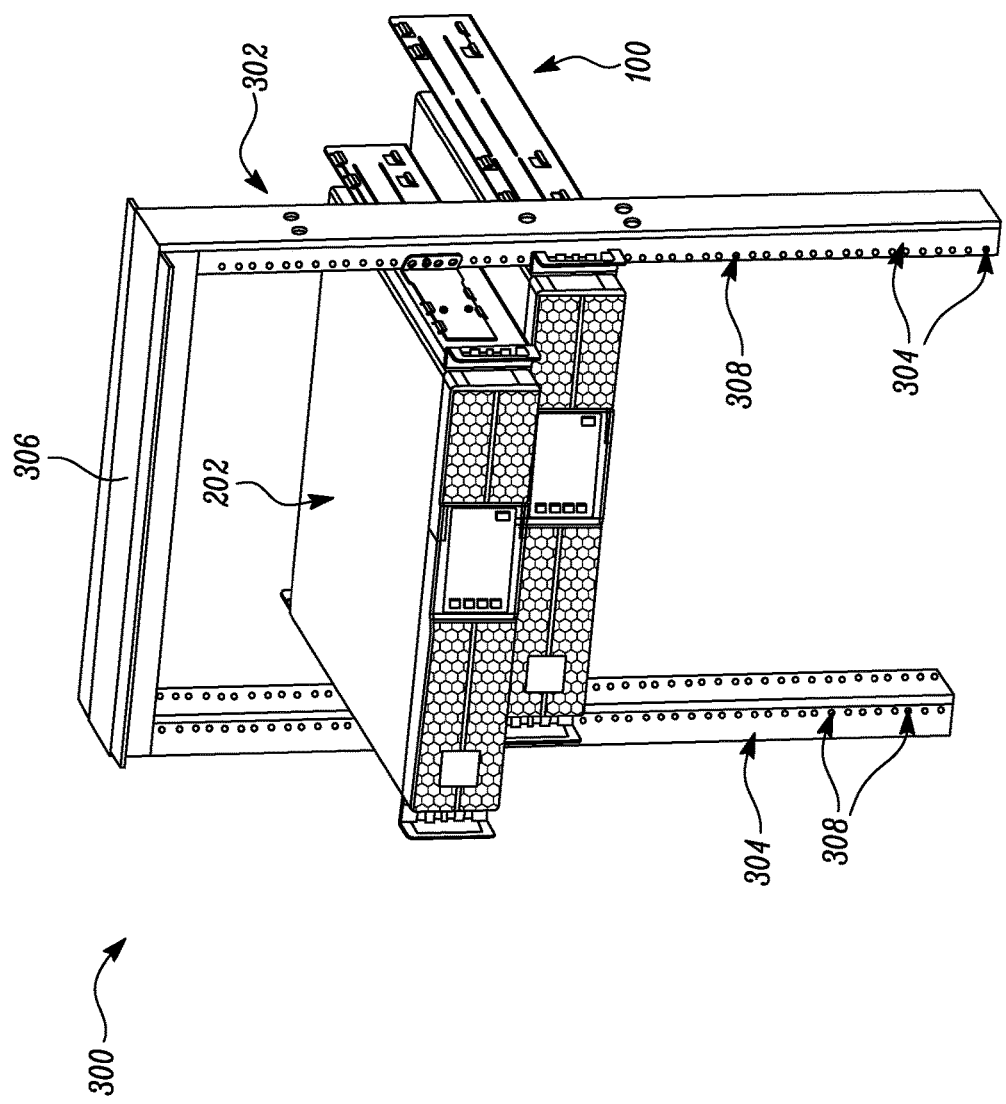
FIG. 4 illustrates a second perspective view of a computer rack assembly employing a universal rail kit, with respect to an example embodiment of the present disclosure.

FIG. 4 illustrates another computer rack assembly 300 that utilizes the universal rail kit 100. A two-post computer rack 302 has two vertical support members or posts 304 and at least one horizontal support members or posts 306. The two vertical support members 304 define a plurality of post mounting holes 308 down its vertical length (e.g., majority or entirety thereof). In an embodiment, the rack mountable system 202 can be in a "center mount" configuration. In a "center mount" configuration, the first portion 116 of the slidable member 102 is detached, leaving only the second portion 118 remaining on the slidable member. The slide mounting surface 122 on the distal end 112 of the slidable member 102 interfaces with the vertical support member 304 of the two-post computer rack 302. The rack mountable system 202 can rest on the "L-shaped" support rail 136 of the support member 104, and the slidable member 102 can be coupled to the support member 104 using at least two coupling tabs 138. In the case of a "center mount" configuration, it is to be understood that equal or near equal (e.g., 40-60% or 60-40% split, totaling 100%) sections of that second portion 118 may be fore and aft of a corresponding vertical support member 304 and be within the scope of what is considered to be a "center mount" configuration in this instance.

In another embodiment, the rack mountable system 202 can be in a "front mount" configuration. In a "front mount" configuration, the support mounting surface 140 on the support member 104 interfaces with the vertical support member 304 of the two-post computer rack 302. The slidable member 102 is removed, leaving the support member as the only piece of the universal rail kit 100.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A slide rail assembly for supporting an electronic unit, the slide rail assembly comprising:
   a first support member comprising:
      a flat body comprising a first and second side and a proximal and distal end,
      a proximal upper coupling tab extending from the first side at the proximal end,
      a proximal lower coupling tab extending from the first side at the proximal end,
      a distal upper coupling tab extending from the first side at the distal end, and
      a distal lower coupling tab extending from the first side at the distal end, and
   a sliding member comprising:
      a flat body comprising a first side and a second side and a proximal end and a distal end, and
      a separation line located between the proximal end and the distal end of the flat body, wherein the sliding member is movable between:
         a first position wherein the flat body engages the distal upper coupling tab and the distal lower coupling tab, and
         a second position wherein the flat body engages the proximal upper coupling tab.
2. The slide rail assembly of claim 1, wherein the first support member further comprises a support ledge extending from the second side and at least partially between the proximal end and the distal end and configured to support an electronic unit.

3. The slide rail assembly of claim 2, wherein the support ledge of the first support member extends from the distal end of the first support member to the proximal end of the first support member.

4. The slide rail assembly of claim 1, wherein the first support member further comprises a mounting tab extending from the first side and from the proximal end.

5. The slide rail assembly of claim 1, wherein the sliding member further comprises a mounting tab extending from the first side and the distal end.

6. The slide rail assembly of claim 1, wherein the first position is configured to support the electronic unit in a first computer rack.

7. The slide rail assembly of claim 6, wherein the second position is configured to support the electronic unit in a second computer rack.

8. The slide rail assembly of claim 7, wherein the second computer rack has a depth of 36".

9. The slide rail assembly of claim 6, wherein the first computer rack has a depth of 24".

10. The slide rail assembly of claim 1, wherein the sliding member comprises a first portion and a second portion.

11. The slide rail assembly of claim 10, wherein the second portion is detachable from the first portion at the separation line.

12. The slide rail assembly of claim 11, wherein the sliding member further comprises a separation tool hole.

13. A system for housing an electronic unit in a computer rack, the system comprising:
    a computer rack comprising a plurality of vertical support members, and a plurality of horizontal support members;
    a slide rail assembly comprising a first support member, a sliding member, wherein the sliding member is movable between a first position and a second position relative to the first support member, wherein the sliding member comprises a separation line configured to allow a portion of the sliding member to be detached; and
    an electronic unit.

14. The system of claim 13, wherein a mounting tab of the first support member comprises mounting holes for mounting on the computer rack.

15. The system of claim 13, wherein a mounting tab of the sliding member comprises mounting holes for mounting on the computer rack.

16. The system of claim 13, wherein the computer rack is comprised of two of the vertical support members.

17. The system of claim 13, wherein the computer rack is comprised of four of the vertical support members.

18. A method for supporting an electronic unit in a computer rack using a slide rail assembly, wherein the slide rail assembly includes a sliding member comprising a separation line configured to allow a portion of the sliding member to be detached, the method comprising:
    attaching a first support member of the slide rail assembly to the computer rack,
    attaching the sliding member to the first support member,
    moving the sliding member between a first and second position in relation to the first support member, and
    placing an electronic unit on a support ledge of the first support member.

19. The method of claim 18, further comprising locking the sliding member to the first support member using a locking track that extends along a length of the first support member.

20. The method of claim 18, wherein the step of moving the sliding member between the first position and the second position further comprises ensuring that the slide rail assembly is attached at two points to the computer rack.

* * * * *